US006455334B1

(12) United States Patent
Goruganthu et al.

(10) Patent No.: US 6,455,334 B1
(45) Date of Patent: Sep. 24, 2002

(54) PROBE GRID FOR INTEGRATED CIRCUIT ANALYSIS

(75) Inventors: Rama R. Goruganthu; Jeffrey D. Birdsley; Michael R. Bruce; Brennan V. Davis; Rosalinda M. Ring, all of Austin; Glen Gilfeather, Del Valle, all of TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/409,982

(22) Filed: Sep. 30, 1999

(51) Int. Cl.[7] .............................................. H01L 21/66
(52) U.S. Cl. .............................. 438/14; 438/15; 438/17; 438/18; 438/108; 438/977; 257/48; 257/621
(58) Field of Search ........................... 438/14, 15, 16, 438/4, 17, 18, 108; 257/48, 621, 622, 774, 778; 250/307, 389

(56) References Cited

U.S. PATENT DOCUMENTS

| | | | | |
|---|---|---|---|---|
| 5,083,007 A | * | 1/1992 | Spletter et al. | 219/121.64 |
| 5,156,997 A | * | 10/1992 | Kumar et al. | 437/183 |
| 6,069,366 A | * | 5/2000 | Goruganthu et al. | 250/559.27 |
| 6,194,235 B1 | * | 2/2001 | Ma | 438/14 |
| 6,245,587 B1 | * | 6/2001 | Vallett | 438/18 |
| 6,277,659 B1 | * | 8/2001 | Goruganthu et al. | 438/14 |
| 6,281,029 B1 | * | 8/2001 | Goruganthu et al. | 438/18 |
| 6,285,036 B1 | * | 9/2001 | Goruganthu et al. | 250/559.27 |

* cited by examiner

*Primary Examiner*—John F. Niebling
*Assistant Examiner*—Olivia T Luk

(57) ABSTRACT

The ability to monitor virtually any portion of semiconductor device is enhanced via a grid formed for analyzing circuitry in the semiconductor device. According to an example embodiment of the present invention, a grid having a plurality of narrow probe points is formed extending over target circuitry in a semiconductor device. The grid is accessed and used for monitoring various target circuitry within the device by accessing the part of the grid that corresponds to the portion of the target circuitry to which access is desired.

24 Claims, 5 Drawing Sheets

PROBE GRID FOR INTEGRATED CIRCUIT ANALYSIS

FIELD OF THE INVENTION

The present invention relates generally to semiconductor devices, and more particularly, to techniques for analyzing and debugging circuitry within an integrated circuit device.

BACKGROUND OF THE INVENTION

The semiconductor industry has recently experienced technological advances that have permitted dramatic increases in circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages. A by-product of such high-density and high functionality in semiconductor devices has been the demand for increased numbers of external electrical connections to be present on the exterior of the die and on the exterior of the semiconductor packages which receive the die, for connecting the packaged device to external systems, such as a printed circuit board.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

Traditionally, integrated circuits have been tested using methods including directly accessing circuitry or devices within the integrated circuit. In addition, many methods require the circuit to be powered. Directly accessing the circuitry is difficult for several reasons. For instance, in flip-chip type devices, transistors and other circuitry are located in a very thin epitaxially-grown silicon layer in a circuit side of the die. The circuit side of the die is arranged face-down on a package substrate. This orientation provides many operational advantages. However, due to the face-down orientation of the circuit side of the die, the transistors and other circuitry near the circuit side are not readily accessible for testing, modification, or other purposes. Therefore, access to the transistors and circuitry near the circuit side is from the back side of the chip.

Since access to the transistors and circuitry in flip-chips is generally from the back side of the device, it is often necessary to mill through the back side and probe certain circuit elements in order to test the device. Often, the area between transistors and other circuitry in flip-chip and other integrated circuit devices is very small. Probing points between such circuitry and devices is difficult to achieve without contacting the devices between which the probes are formed and potentially causing damage. In addition, typical probes are not small enough to enable the addition of a plurality of such probes in a relatively small space. These and other difficulties inhibit the access and probing of circuit areas located between and beneath such circuitry. A related inhibition to the analysis of semiconductor devices is the lack of a readily usable manner in which to access and test the devices throughout the die. This problem continually worsens as the amount of devices within a typical semiconductor die number into the millions and are formed at distances between each other ranging in the micron or sub-micron level.

SUMMARY OF THE INVENTION

The present invention is directed to a method and system for forming a grid in a semiconductor device for improving analysis of the device involving using the grid to access and monitor various portions of the circuitry. The present invention is exemplified in a number of implementations and applications, some of which are summarized below.

According to an example embodiment of the present invention, a grid having several elongated narrow conductive via probes is formed in a semiconductor device having circuitry in a circuit side opposite a back side. The grid is created by forming a plurality of probe points extending over target circuitry in the semiconductor device. A target node in the circuitry is monitored by accessing part of the grid coupled to the target node.

According to another example embodiment of the present invention, a system is arranged for analyzing a semiconductor device having circuitry in a circuit side opposite a back side. The system includes a substrate removal device adapted to remove substrate from the semiconductor device and form an exposed region over a target node. An ion deposition device is also included and is adapted to form a grid having a plurality of probe points extending over the target node. A testing arrangement is adapted to use the grid and to monitor the device.

The above summary of the present invention is not intended to describe each illustrated embodiment or every implementation of the present invention. The figures and detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
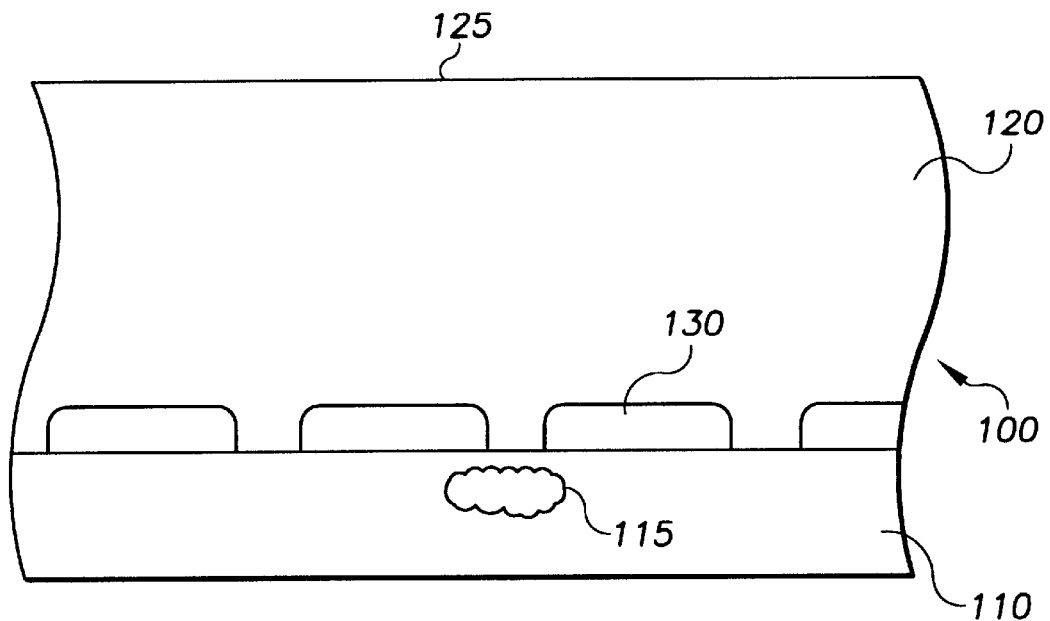
FIG. 1 is a semiconductor device for use in connection with an example embodiment of the present invention.
Figure 2:
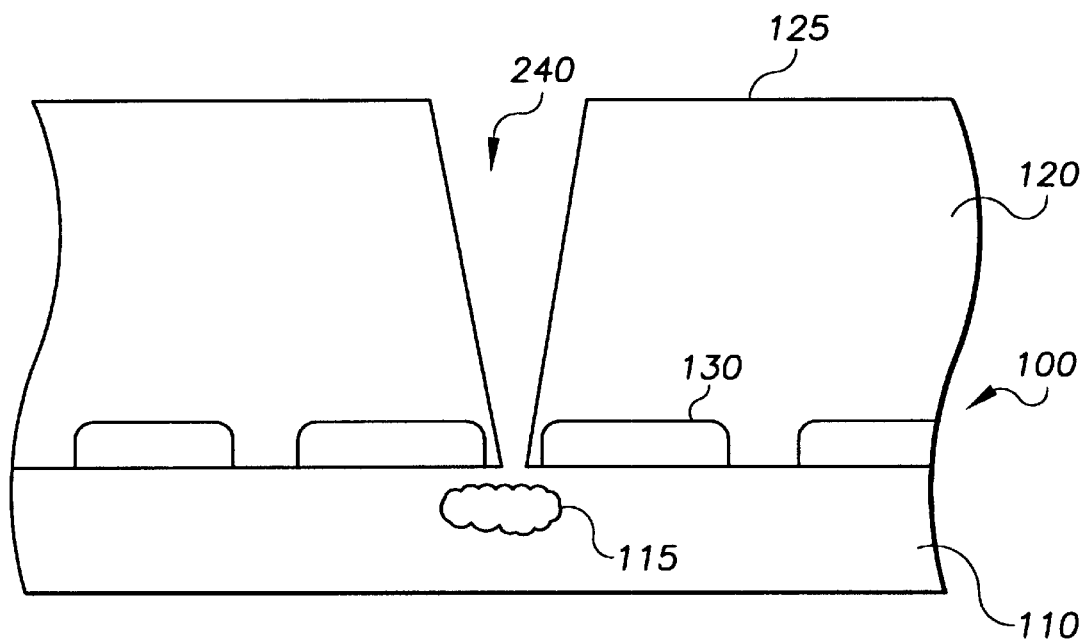
FIG. 2 is the semiconductor device of FIG. 1 having undergone a processing step, according to an example embodiment of the present invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and the invention has been found to be particularly suited for flip-chip and other type devices requiring or benefiting from analysis involving monitoring circuitry within the device. While the present invention is not necessarily limited to such devices and analysis, various aspects of the invention may be appreciated through a discussion of various examples using this context.

According to an example embodiment of the present invention, a grid having elongated probes is formed over target circuitry in a semiconductor device. Using the grid, various portions of the target circuitry are easily accessed for monitoring the device. For example, in addition to monitoring a particular target portion of the device, the grid can be used to access and monitor several areas of the device at once. Monitoring several areas at once is particularly useful for comparing different regions of the device and searching for defects, such as short circuits that generate heat. Comparison can also be made by comparing an image of the grid to a reference image created from a non-defective semiconductor device, and detecting variations between the images. In addition, using elongated probes to form the grid allows access to target circuitry formed in close proximity, such as between closely-spaced transistors or in buried layers of circuitry in the semiconductor die. Furthermore, using elongated probes to form the grid allows close placement of the probes to form a dense grid useful for accessing virtually any portion of closely-spaced circuitry without short-circuiting between the probes or damaging the circuitry.

Figure 3:
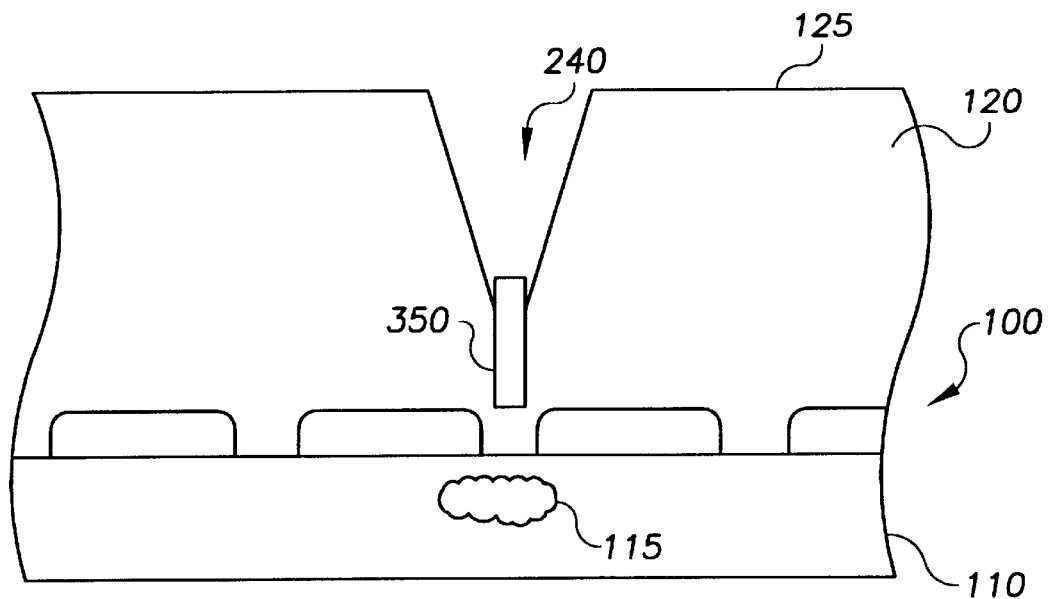
FIG. 3 is the semiconductor device of FIG. 2 having undergone another processing step, according to another example embodiment of the present invention.
Figure 4:
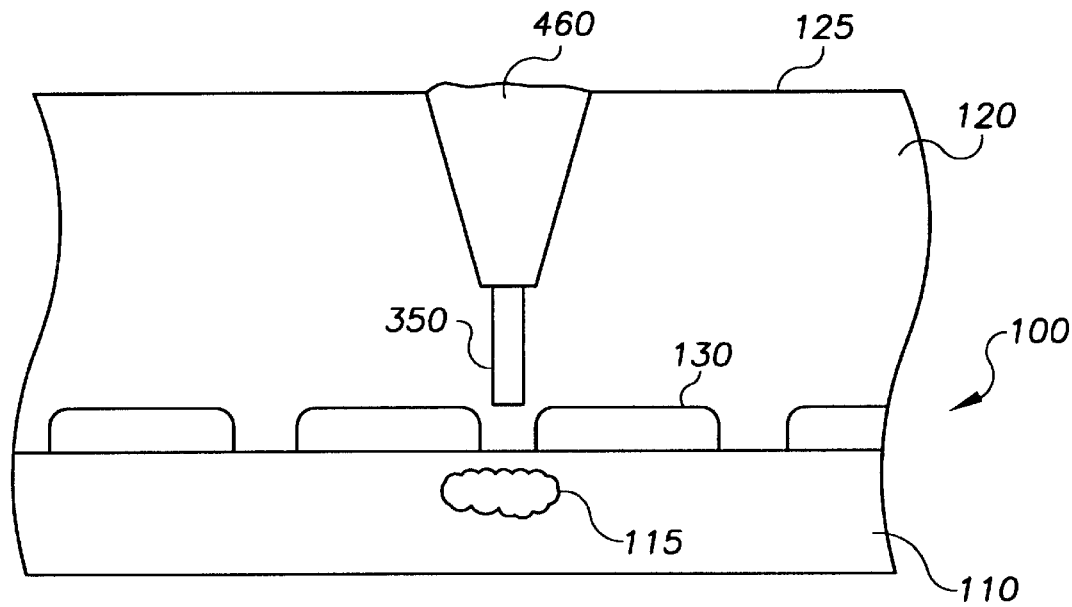
FIG. 4 is the semiconductor device of FIG. 3, having undergone another processing step, according to an example embodiment of the present invention.
Figure 5:
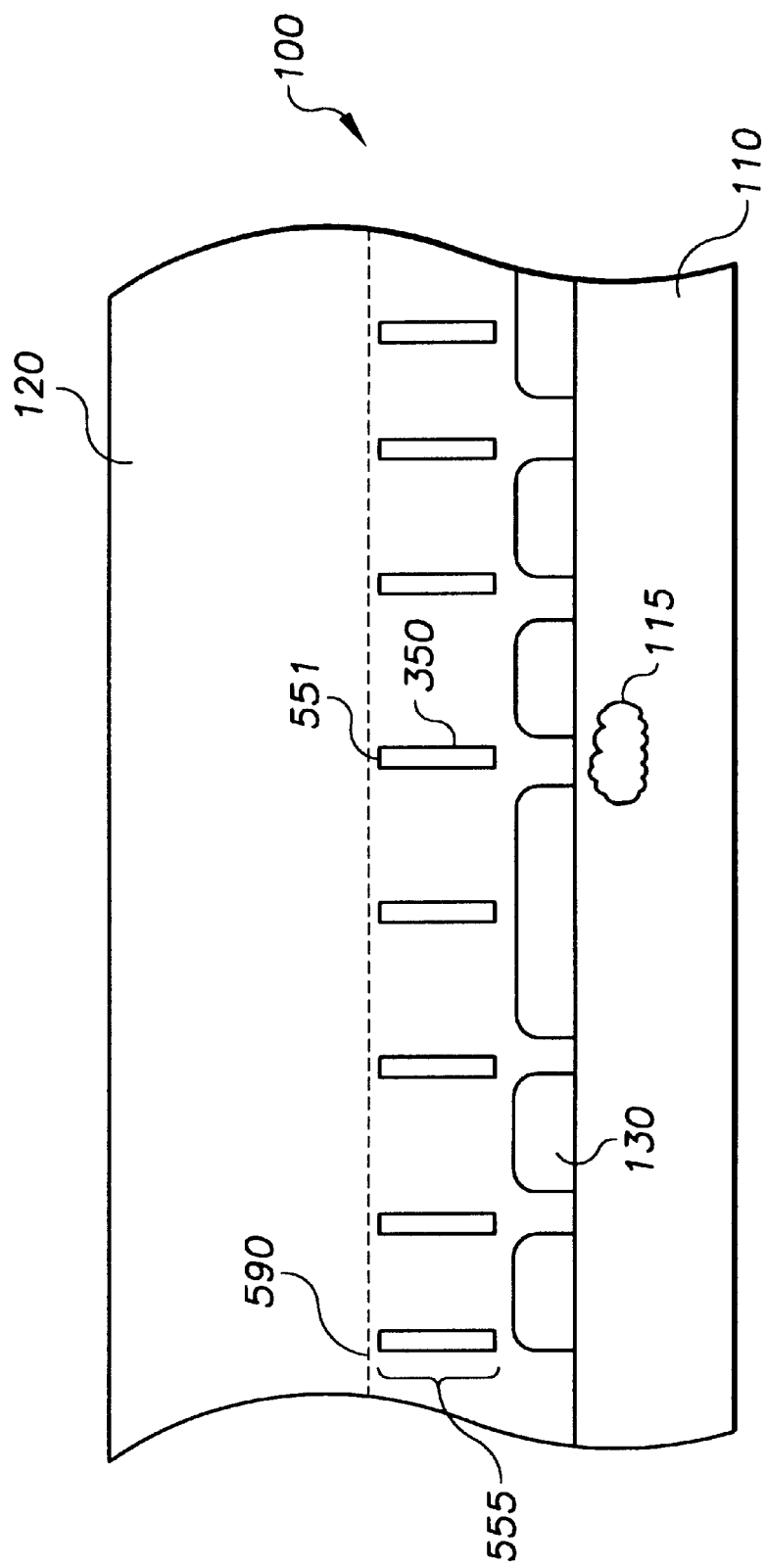
FIG. 5 is another semiconductor device having a plurality of probe points forming a grid, according to another example embodiment of the present invention.

The grid can be formed in various manners. For instance, FIGS. 1–4 show steps in the formation of an elongated conductive probe, and FIG. 5 shows several such probes forming a portion of the grid, according to an example embodiment of the present invention. In FIG. 1, a semiconductor device 100 for use in connection with the present invention has target circuitry 115 in a circuit side 110 opposite a back side 120, and elements 130 formed within the device. Substrate is removed from the semiconductor device 100 at a back side surface 125 in FIG. 2, and an exposed region 240 is formed over the target circuitry 115. The substrate can be removed, for example, using a FIB or other ion bombardment device, a laser etching device, chemical mechanical polishing, or a combination thereof. In FIG. 3, an insulated conductor 350 is formed in the exposed region 240 using, for example, Gallium ion implantation. In one implementation, the substrate removal and the formation of the insulated conductor are performed with the same FIB device.

In another example embodiment of the present invention, the probe is formed by first forming an insulating layer around the walls of the exposed region 240 and depositing conductive material inside the insulating layer. One particular method of forming the conductor includes depositing an insulating material having a conductive core in the exposed region in a single step. This method facilitates the formation of very narrow, sub-micron width probes by forming an exposed region having an aspect ratio of at least about 4. For a more detailed explanation of forming such a conductor, reference may be made to co-pending patent application Ser. No. 09/383,790, Ring et al., filed on Aug. 26, 1999, entitled "ARRANGEMENT AND METHOD FOR CHARACTERIZATION OF FIB INSULATOR DEPOSITION", which is assigned to the assignee of the present invention and is incorporated herein by reference. In this manner, the conductor can be deposited using one process for creating both a conductive insulator core and a non-conductive insulator around the core. In addition, the conductor can be deposited using a FIB that is also used to form the exposed region.

The insulated conductor 350 of FIG. 3 is shown extending from a location over the target circuitry 115. Alternatively, the insulated conductor 350 can be located closer to the target circuitry and between the elements 130. The insulated conductor 350 is one of a plurality of conductors that form a grid. In one implementation, the grid is formed in a 5×5 micrometer trench. Other implementations involve forming the grid over most of the target circuitry, or most of the semiconductor device.

FIG. 5 shows a grid portion 555 having probe points 350. The grid is used to monitor the target circuitry 115 or other devices 130, using methods such as direct coupling, capacitive coupling, electron-beam probing, scanning probe microscopy (SPM), scanning tunneling microscopy, electric force microscopy, scanning capacitance microscopy (atomic force microscopy) infrared thermography, laser scanning microscopy, or temperature detection. Using these methods, waveforms, magnetic fields, heat patterns, and other aspects of the device can be monitored. In addition, various types of circuitry or devices can be monitored in this manner, such as source, gate, or drain regions, metal interconnects, transistors, or other devices typically used in semiconductor devices. Capacitive coupling is particularly useful because the device can be monitored without necessarily altering or otherwise damaging the circuitry due to the addition of the conductor to the circuit. One method of capacitively coupling includes forming the grid at about 3 microns over and away from the target circuitry.

Connection to the conductor 350 for analysis can be made in several manners. For instance, one example method for connecting to the insulated conductor 350 is shown in FIG. 4, where conductive material, such as probe 460, has been deposited in the exposed region 240 above the insulated conductor 350. Connection is then made via the deposited conductive material 460. In another implementation, not shown in FIG. 4, the insulated conductor 350 extends through the back side and to the back side surface 125, and connection is made at the back side surface. In still another implementation, and referring to FIG. 5, after the grid is formed the portion over the probe in the exposed region 240 is filled with silicon substrate. When access to the probe is desired, the substrate is removed to the dashed line 590 and access is made directly to the end 551 of the probe. The substrate removal can be accomplished using various processes. For example, chemical-mechanical polishing can be used to globally thin the back side 120 and expose some or all of the grid 555. Local thinning methods, including using devices such as a FIB or a laser etching device, can also be used to expose a portion of the grid 555.

Although FIGS. 1–4 show the probe and grid being formed and accessed via the back side surface 125, probes are formed and accessed in other manners in other example implementations of the present invention. For instance, probes can be formed via the circuit side 110, and access to the resulting grid can be via either side as applications vary. The probes can be formed as shown in the back side, in the circuit side, or in both sides. In addition, the probes can be formed during the manufacture of the device, or formed after some or all of the device has been made, such as shown in FIGS. 1–4. When the probes are formed during the manufacture of the device, the resulting grid may be used for analysis before or after the manufacture of the device is complete.

In another particular application, the probe grid is formed during manufacture of the device and extends into the back side, such as shown in FIG. 3. The grid can be accessed for monitoring the device while the device is being manufactured. In an alternate implementation, substrate is re-formed in the exposed region 240, and the manufacturing process is completed. When access to the grid is desired for post-manufacturing analysis, substrate is removed to expose a portion of the grid having one or more probes and the target region is accessed via the exposed probe(s). In another particular application, the probes are formed via the circuit side as the die is manufactured and without removing substrate via the back side surface 125. Again, when access to the target circuitry is desired, the grid is accessed by removing substrate and exposing one or more probes.

Figure 6:
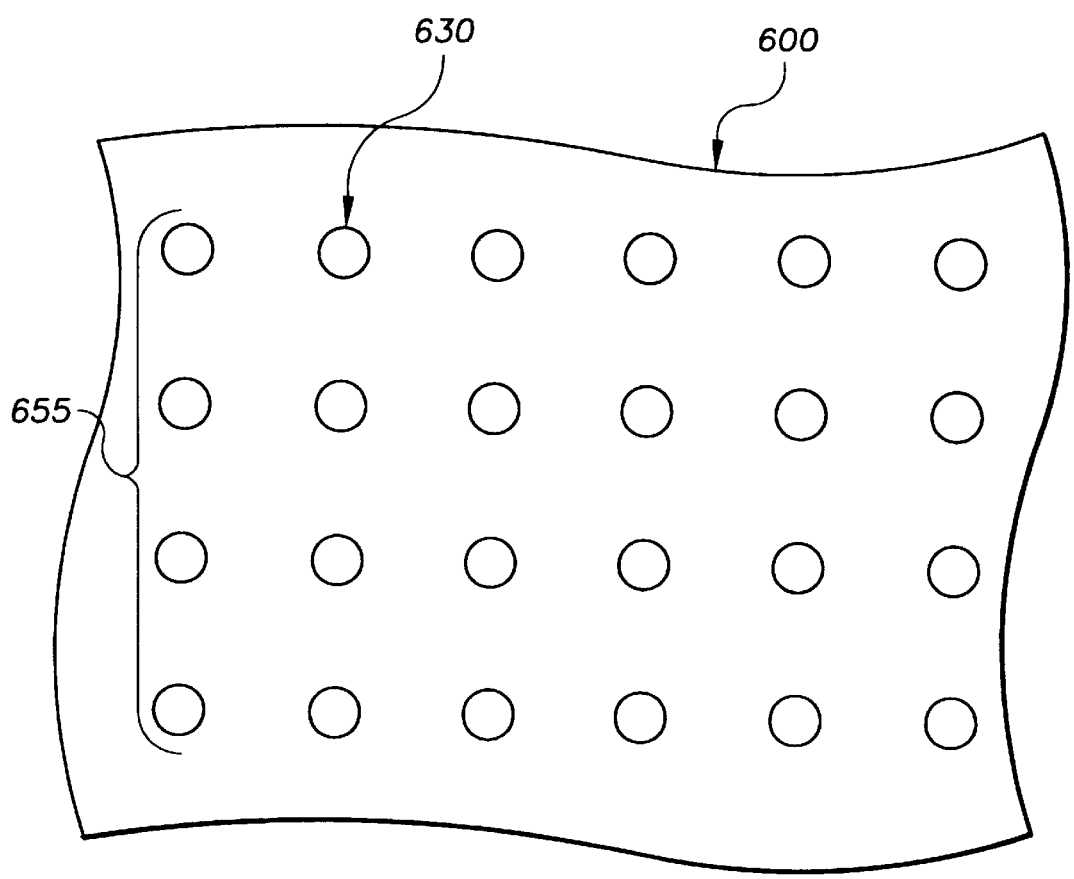
FIG. 6 is top view of another semiconductor device, such as shown in FIG. 5, having a plurality of probe points forming a grid, according to another example embodiment of the present invention.

FIG. 6 is a top view of a portion of a semiconductor device 600, according to another example embodiment of the present invention. Grid portion 655 is formed from an array of probes 630. Although FIG. 6 shows the grid portion 655 having proportionally-spaced probes 630, the grid may be formed having a variety of spatial probe arrangements, and can be tailored to the particular type of semiconductor die or to achieve various desired testing results. In one application, an image of the grid portion 655 is created and used for analyzing the device 600. Generating an overview image of the grid is particularly useful for comparing the grid of a device under test with a reference grid, and determining therefrom any abnormalities in the device under test.

Figure 7:
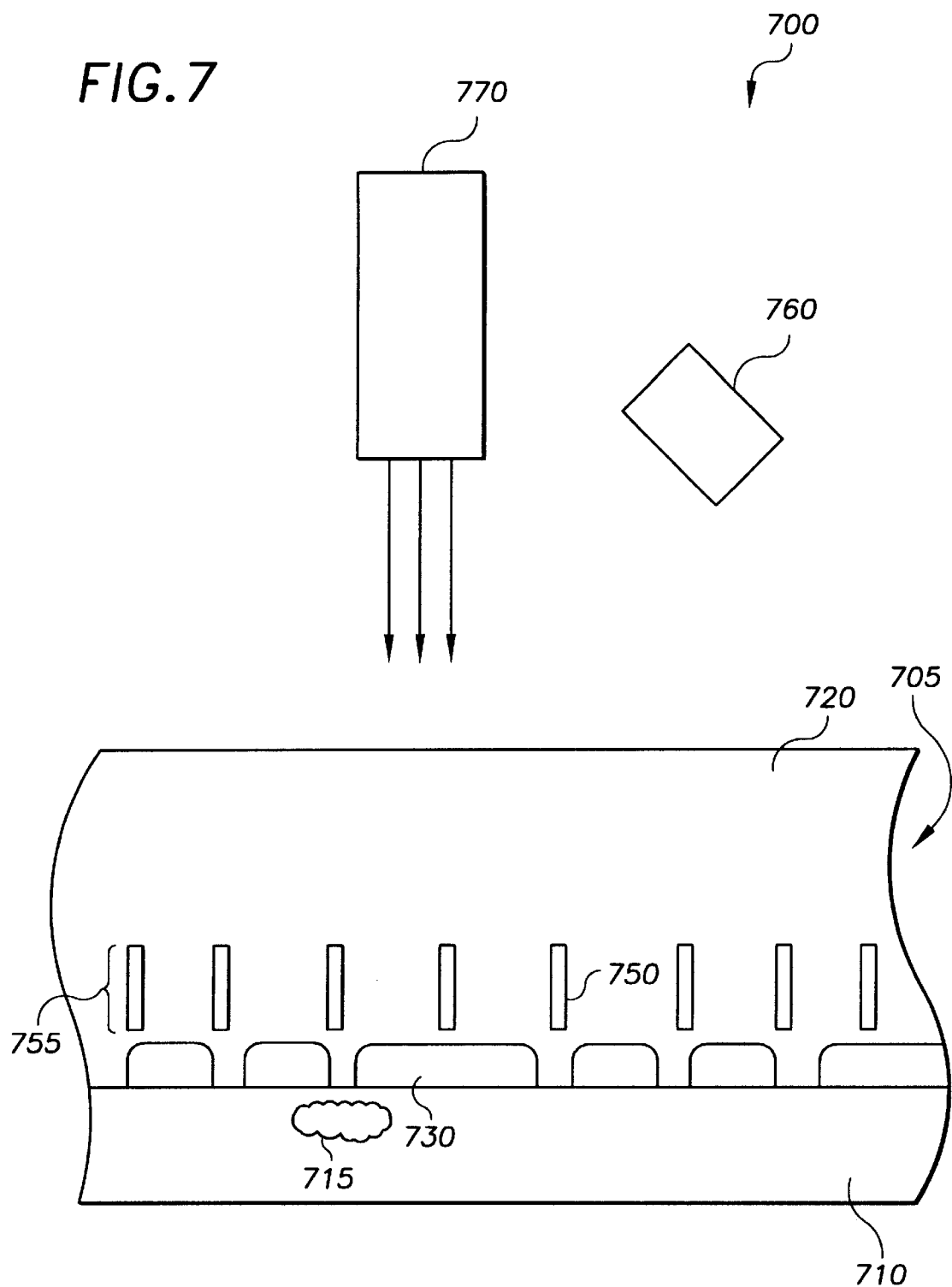
FIG. 7 is a system for analyzing a semiconductor device, according to another example embodiment of the present invention.

According to another example embodiment of the present invention, a system is arranged for analyzing a semiconductor device having circuitry in a circuit side opposite a back side. FIG. 7 shows one example such system 700. FIB device 770 is used to form probes 750 making up a grid 755 in the back side 720 and over circuitry 715 and devices 730 in the circuit side 710 of the semiconductor device 705. FIB device 770 may also be used for removing substrate from the back side 720 and exposing a portion of the grid 755. Detection device 760 is arranged for monitoring the device via the grid 755. For example, monitoring device 760 may include an IR microscope used for acquiring a thermal image from the grid 755. In other implementations, electrical contact with the grid 755 is made and the device is monitored, such as by obtaining a waveform. Other analysis devices may also be used in connection with the system 700, such as a power supply, a test fixture, a computer, a SPM device, other types of microscopes, or a signal detection device.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor device having circuitry in a circuit side opposite a back side, the method comprising:

forming a grid having a plurality of probe points extending over target circuitry in the semiconductor device; and accessing the grid and monitoring the semiconductor device by coupling energy from the target circuitry to the grid.

2. The method of claim 1, wherein forming a grid having a plurality of probe points extending over target circuitry in the semiconductor device comprises:

(A) removing substrate from the semiconductor device and forming an exposed region over a target node;

(B) forming an insulated narrow conductor to form a probe point; and (C) repeating steps A and B until the grid is formed.

3. The method of claim 1, wherein forming a grid having a plurality of probe points extending over target circuitry in the semiconductor device includes forming the grid in the back side of the device.

4. The method of claim 3, wherein forming the grid includes forming the grid before the manufacture of the device is complete, and wherein accessing the grid includes accessing the grid for post-manufacturing analysis.

5. The method of claim 3, wherein forming the grid includes forming the grid before the manufacture of the device is complete, and wherein accessing the grid includes accessing the grid before the manufacture of the device is complete.

6. The method of claim 3, wherein forming the grid includes forming the grid after the manufacture of the device is complete, and wherein accessing the grid includes accessing the grid for post-manufacturing analysis.

7. The method of claim 3, wherein at least one of the plurality of probe points is formed extending through the back side.

8. The method of claim 1, wherein forming a grid having a plurality of probe points extending over target circuitry in the semiconductor device includes forming the grid in the circuit side of the device.

9. The method of claim 8, wherein forming the grid includes forming the grid before the manufacture of the device is complete, and wherein accessing the grid includes accessing the grid for post-manufacturing analysis.

10. The method of claim 8, wherein forming the grid includes forming the grid before the manufacture of the device is complete, and wherein accessing the grid includes accessing the grid before the manufacture of the device is complete.

11. The method of claim 8, wherein forming the grid includes forming the grid after the manufacture of the device is complete, and wherein accessing the grid includes accessing the grid for post-manufacturing analysis.

12. The method of claim 2, wherein forming an insulated narrow conductor to form a probe point comprises depositing a material in the exposed region over the target node and using the deposited material to form simultaneously a conductive core and an immediately adjacent insulator.

13. The method of claim 1, wherein the plurality of probe points is formed using a Gallium ion beam.

14. The method of claim 1, wherein forming a grid having a plurality of probe points includes forming a probe point having a width of between about 0.5 microns and 1 micron.

15. The method of claim 1, wherein forming a grid having a plurality of probe points includes forming a probe point that extends into an epi region of the device and is capacitively coupled to at least one of: a source, a drain, a gate, and a metal interconnect.

16. The method of claim 2, wherein removing substrate from the semiconductor device and forming an exposed region over a target node includes milling with an aspect ratio of at least about 4.

17. The method of claim 1, wherein the grid is formed in a trench having a diameter of about 5 microns.

18. The method of claim 1, wherein forming a grid having a plurality of probe points extending over target circuitry in the semiconductor device includes forming probe points beginning at about 3 microns over the target circuitry.

19. The method of claim 1, wherein accessing the grid and monitoring the semiconductor device by coupling energy from the target circuitry to the grid includes capacitively coupling to the target circuitry.

20. The method of claim 1, wherein accessing the grid and monitoring the semiconductor device includes monitoring at least one of: a waveform, a magnetic field, and heat.

21. The method of claim 1, wherein accessing the grid and monitoring the semiconductor device includes probing using at least one of: electron-beam probing, scanning probe microscopy (SPM), scanning tunneling microscopy, electric force microscopy, scanning capacitance microscopy, atomic force microscopy, infrared thermography, and a laser scanning microscope.

22. The method of claim 1, wherein accessing the grid and monitoring the semiconductor device comprises removing substrate from the semiconductor device and exposing the grid.

23. The method of claim 22, wherein accessing the grid and monitoring the semiconductor device further comprises depositing conductive material on the exposed grid and using the deposited conductive material to access the grid.

24. The method of claim 1, wherein the target circuitry includes about all of the circuitry over which the grid is formed.

* * * * *